United States Patent
Kasuga et al.

(10) Patent No.: US 10,076,032 B2
(45) Date of Patent: Sep. 11, 2018

(54) SUBSTRATE FOR PRINTED CIRCUIT BOARD, PRINTED CIRCUIT BOARD, AND METHOD FOR PRODUCING SUBSTRATE FOR PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Takashi Kasuga, Osaka (JP); Yoshio Oka, Osaka (JP); Shigeyoshi Nakayama, Osaka (JP); Jinjoo Park, Shiga (JP); Sumito Uehara, Shiga (JP); Kousuke Miura, Shiga (JP); Hiroshi Ueda, Shiga (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/127,165

(22) PCT Filed: Mar. 19, 2015

(86) PCT No.: PCT/JP2015/058208
§ 371 (c)(1),
(2) Date: Sep. 19, 2016

(87) PCT Pub. No.: WO2015/141769
PCT Pub. Date: Sep. 24, 2015

(65) Prior Publication Data
US 2017/0127516 A1    May 4, 2017

(30) Foreign Application Priority Data

Mar. 20, 2014 (JP) ................. 2014-058445

(51) Int. Cl.
*H05K 1/05* (2006.01)
*H05K 1/09* (2006.01)
(Continued)

(52) U.S. Cl.
CPC ............... *H05K 1/092* (2013.01); *H05K 1/05* (2013.01); *H05K 3/022* (2013.01); *H05K 3/108* (2013.01);
(Continued)

(58) Field of Classification Search
CPC .......... H05K 1/092; H05K 1/05; H05K 3/022; H05K 3/108; H05K 3/384; H05K 2203/072
(Continued)

(56) References Cited

U.S. PATENT DOCUMENTS

| | | | |
|---|---|---|---|
| 3,322,881 A | 5/1967 | Schneble et al. | |
| 3,767,538 A | 10/1973 | Politycki et al. | |

(Continued)

FOREIGN PATENT DOCUMENTS

| | | |
|---|---|---|
| CN | 1527655 A | 9/2004 |
| EP | 2150095 A1 | 2/2010 |

(Continued)

OTHER PUBLICATIONS

U.S. Appl. No. 15/213,216, filed Jul. 18, 2016, Oka.
(Continued)

*Primary Examiner* — Timothy Thompson
*Assistant Examiner* — Michael F McAllister
(74) *Attorney, Agent, or Firm* — Drinker Biddle & Reath LLP (57) ABSTRACT

A substrate for a printed circuit board includes a base film having an insulating property; a first conductive layer formed on at least one of surfaces of the base film by application of a conductive ink containing metal particles;

(Continued)

and a second conductive layer formed, by plating, on a surface of the first conductive layer, the surface being on a side opposite to the base film, wherein a region near an interface between the base film and the first conductive layer contains a metal oxide species based on a metal of the metal particles and a metal hydroxide species based on the metal of the metal particles, the metal oxide species in the region near the interface between the base film and the first conductive layer has a mass per unit area of 0.1 μg/cm$^2$ or more and 10 μg/cm$^2$ or less, and a mass ratio of the metal oxide species to the metal hydroxide species is 0.1 or more.

9 Claims, 2 Drawing Sheets (51) Int. Cl.
*H05K 3/02* (2006.01)
*H05K 3/10* (2006.01)
*H05K 3/38* (2006.01)

(52) U.S. Cl.
CPC ....... *H05K 3/384* (2013.01); *H05K 2203/072* (2013.01)

(58) Field of Classification Search
USPC .......................................................... 174/257
See application file for complete search history.

(56) References Cited

U.S. PATENT DOCUMENTS

| | | | |
|---|---|---|---|
| 4,959,121 A | 9/1990 | Dumas et al. | |
| 5,196,232 A | 3/1993 | Kitazaki et al. | |
| 5,383,093 A | 1/1995 | Nagasaka | |
| 5,652,042 A | 7/1997 | Kawakita et al. | |
| 5,739,055 A * | 4/1998 | Ryu | H01L 21/4846 174/257 |
| 6,258,223 B1 | 7/2001 | Cheung et al. | |
| 6,277,353 B1 | 8/2001 | Gard et al. | |
| 6,337,037 B1 * | 1/2002 | St. John | H01B 1/22 252/500 |
| 6,379,845 B1 | 4/2002 | Inazawa et al. | |
| 6,486,409 B1 | 11/2002 | Sako | |
| 6,730,400 B1 | 5/2004 | Komatsu et al. | |
| 7,470,306 B2 | 12/2008 | Inazawa et al. | |
| 8,764,960 B2 * | 7/2014 | Chung | C25D 5/48 205/136 |
| 2002/0004180 A1 * | 1/2002 | Hotta | G03F 7/0045 430/311 |
| 2003/0146019 A1 | 8/2003 | Hirai | |
| 2004/0134682 A1 | 7/2004 | En et al. | |
| 2004/0185388 A1 * | 9/2004 | Hirai | H05K 1/097 430/322 |
| 2005/0189520 A1 | 9/2005 | Okada et al. | |
| 2006/0043346 A1 | 3/2006 | Kodas et al. | |
| 2006/0055021 A1 | 3/2006 | Yamamoto | |
| 2006/0163744 A1 | 7/2006 | Vanheusden et al. | |
| 2007/0153488 A1 | 7/2007 | Yang et al. | |
| 2007/0216292 A1 * | 9/2007 | Seo | C09J 133/10 313/506 |
| 2007/0261234 A1 | 11/2007 | Song et al. | |
| 2008/0075836 A1 | 3/2008 | Chen et al. | |
| 2008/0083698 A1 | 4/2008 | Jung et al. | |
| 2008/0157029 A1 | 7/2008 | Lee et al. | |
| 2008/0268637 A1 | 10/2008 | Inaba | |
| 2009/0139868 A1 | 6/2009 | Shrader et al. | |
| 2009/0142648 A1 | 6/2009 | Kohl et al. | |
| 2009/0202915 A1 | 8/2009 | Modeki et al. | |
| 2009/0236137 A1 | 9/2009 | Kaneda et al. | |
| 2009/0242854 A1 * | 10/2009 | Li | C09D 11/101 252/519.33 |
| 2010/0025080 A1 * | 2/2010 | Park | H05K 3/246 174/250 |
| 2010/0044094 A1 | 2/2010 | Oka et al. | |
| 2010/0132986 A1 * | 6/2010 | Hackert | H05K 3/182 174/257 |
| 2010/0261031 A1 * | 10/2010 | Chung | C25D 5/48 428/601 |
| 2012/0031656 A1 * | 2/2012 | Oka | C23C 28/00 174/257 |
| 2014/0166495 A1 | 6/2014 | Oka et al. | |
| 2015/0147486 A1 | 5/2015 | Abed et al. | |
| 2018/0014403 A1 | 1/2018 | Kasuga et al. | |

FOREIGN PATENT DOCUMENTS

| | | |
|---|---|---|
| JP | H05-259615 A | 10/1993 |
| JP | H06-120640 A | 4/1994 |
| JP | H08-167768 A | 6/1996 |
| JP | H10-1808 A | 1/1998 |
| JP | H10-284842 A | 10/1998 |
| JP | 2000-087121 A | 3/2000 |
| JP | 2000-323618 A | 11/2000 |
| JP | 2001-168496 A | 6/2001 |
| JP | 2002-299833 A | 10/2002 |
| JP | 2003-209341 A | 7/2003 |
| JP | 2004-266133 A | 9/2004 |
| JP | 3570802 B2 | 9/2004 |
| JP | 2004-323866 A | 11/2004 |
| JP | 2005-050965 A | 2/2005 |
| JP | 2005-174828 A | 6/2005 |
| JP | 2005-203484 A | 7/2005 |
| JP | 2005-235533 A | 9/2005 |
| JP | 2005-239472 A | 9/2005 |
| JP | 2006-024808 A | 1/2006 |
| JP | 2006-156617 A | 6/2006 |
| JP | 2006-278845 A | 10/2006 |
| JP | 2006-303368 A | 11/2006 |
| JP | 2007-027454 A | 2/2007 |
| JP | 2007-066824 A | 3/2007 |
| JP | 2008-085345 A | 4/2008 |
| JP | 2008-168585 A | 7/2008 |
| JP | 2008-283012 A | 11/2008 |
| JP | 2012-114152 A | 6/2012 |
| JP | 2013-118362 A | 6/2013 |
| JP | 2013-254910 A | 12/2013 |
| WO | WO-00/10736 A1 | 3/2000 |
| WO | WO 00/33625 A | 6/2000 |
| WO | WO-02/096168 A2 | 11/2002 |
| WO | WO 2007/015545 A1 | 2/2007 |
| WO | WO-2007/112971 A2 | 10/2007 |
| WO | WO-2010/122918 A1 | 10/2010 |

OTHER PUBLICATIONS

U.S. Appl. No. 15/214,278, filed Jul. 19, 2016, Oka.
U.S. Appl. No. 15/127,203, filed Sep. 19, 2016, Kasuga et al.
U.S. Office Action dated Dec. 15, 2016 that issued in U.S. Appl. No. 13/265,108.
U.S. Office Action dated Jan. 12, 2017 that issued in U.S. Appl. No. 14/185,206.
U.S. Advisory Action dated Apr. 12, 2017 that issued in related U.S. Appl. No. 14/185,206.
U.S. Office Action dated Apr. 19, 2017 that issued in related U.S. Appl. No. 13/265,108.
U.S. Office Action dated Apr. 6, 2017 including an Election/Restriction Requirement that issued in related U.S. Appl. No. 15/127,203.
U.S. Office Action dated Jun. 8, 2017 that issued in related U.S. Appl. No. 14/185,206.
Office Action dated Sep. 21, 2017 that issued in related U.S. Appl. No. 15/213,216.
U.S. Office Action dated Jul. 14, 2017 that issued in related U.S. Appl. No. 15/127,203.
Final Office Action dated Sep. 15, 2017 that issued in related U.S. Appl. No. 14/185,206.
Office Action dated Oct. 19, 2017 that issued in related U.S. Appl. No. 15/214,9278.

(56) References Cited

OTHER PUBLICATIONS

Office Action dated Dec. 19, 2017 that issued in related U.S. Appl. No. 14/185,206.
U.S. Office Action dated Feb. 5, 2018 that issued in U.S. Appl. No. 15/544,961 including Double Patenting Rejections on pp. 2-5.
U.S. Office Action dated Mar. 8, 2018 that issued in U.S. Appl. No 15/2141,278.
U.S. Office Action dated Mar. 7, 2018 that issued in U.S. Appl. No. 15/213,216.
U.S. Office Action dated Feb. 5, 2018 that issued in U.S. Appl. No 15/544,961 including Double Patenting Rejections on pp. 2-5.
U.S. Notice of Allowability and the Notice of Allowance dated Apr. 30, 2018 that issued in related U.S. Appl. No. 15/544,961.
Final Office Action dated May 2, 2018 that issued in related U.S. Appl. No. 14/185,206.
U.S. Office Action dated Jan. 11, 2018 that issued in related U.S. Appl. No. 15/127,203.
KR 10-2012-0051991—May 23, 2012—Report Information from ProQuest Dialog—including English-language Abstract—as attached to U.S. Office Action dated Jan. 11, 2018 that issued in related U.S. Appl. No. 15/127,203.
Notice of Allowability and Notice of Allowance and Fee(s) Due dated Jul. 12, 2018 that issued in related U.S. Appl. No. 15/544,961.

\* cited by examiner

SUBSTRATE FOR PRINTED CIRCUIT BOARD, PRINTED CIRCUIT BOARD, AND METHOD FOR PRODUCING SUBSTRATE FOR PRINTED CIRCUIT BOARD

TECHNICAL FIELD

The present invention relates to a substrate for a printed circuit board, a printed circuit board, and a method for producing a substrate for a printed circuit board.

BACKGROUND ART

In recent years, with the trend toward electronic devices having a smaller size and higher performance, there has been a need for a higher density of printed circuit boards. As a substrate for a printed circuit board that satisfies such a need for a higher density, there has been a demand for a substrate for a printed circuit board in which conductive layers have smaller thicknesses.

In order to meet the demand, a substrate for a printed circuit board has been proposed in which a thin copper layer is formed on a heat-resistant insulating base film without using an adhesive layer therebetween (refer to Japanese Patent No. 3570802). In this conventional substrate for a printed circuit board, thin copper layers (first conductive layers) having a thickness of 0.25 to 0.30 μm are formed on both surfaces of a heat-resistant insulating base film by sputtering and, on the layers, thick copper layers (second conductive layers) are formed by electroplating.

CITATION LIST

Patent Literature

PTL 1: Japanese Patent No. 3570802

SUMMARY OF INVENTION

Technical Problem

The above-described conventional substrate for a printed circuit board basically satisfies the need for high-density printed circuits in that a reduction in the thicknesses of conductive layers is achieved. However, in the conventional substrate for a printed circuit board, in order to make the conductive layers firmly adhere to the base film, sputtering is employed to form the first conductive layers. This requires vacuum equipment, which incurs high equipment costs such as building, maintenance, and operation costs of the equipment. In addition, the whole processes including supplying a base film to be used, forming conductive layers, and storing the base film need to be performed in vacuum. In addition, the equipment places a limit to how much the size of the substrate can be increased.

Under the above-described circumstances, the present invention has been made. An object is to provide a substrate for a printed circuit board, a printed circuit board, and a method for producing a substrate for a printed circuit board that enable a sufficient reduction in the thickness of the conductive layer at low cost.

Solution to Problem

The inventors performed thorough studies to address the above-described problem and, as a result, have found the following findings: the larger the amount of a metal oxide species (a metal oxide or a group derived from the metal oxide) in a region near the interface between the base film and the conductive layer in a substrate for a printed circuit board, the higher the adhesion strength between the base film and the conductive layer; the larger the amount of a metal hydroxide species (a metal hydroxide or a group derived from the metal hydroxide) in the region near the interface, the lower the adhesion strength. Thus, the inventors have found that the conductive layer can be made to firmly adhere to the base film without the use of vacuum equipment.

A substrate for a printed circuit board according to an embodiment of the present invention, which has been devised on the basis of such findings, includes a base film having an insulating property; a first conductive layer formed on at least one of surfaces of the base film by application of a conductive ink containing metal particles; and a second conductive layer formed, by plating, on a surface of the first conductive layer, the surface being on a side opposite to the base film. In the substrate for a printed circuit board, a region near an interface between the base film and the first conductive layer contains a metal oxide species based on a metal of the metal particles and a metal hydroxide species based on the metal of the metal particles, the metal oxide species in the region near the interface between the base film and the first conductive layer has a mass per unit area of 0.1 μg/cm$^2$ or more and 10 μg/cm$^2$ or less, and a mass ratio of the metal oxide species to the metal hydroxide species is 0.1 or more.

A printed circuit board according to another embodiment of the present invention, which has been made to address the above-described problem, includes a conductive pattern, wherein the conductive pattern is formed by performing a subtractive method or a semi-additive method on the first conductive layer and the second conductive layer of the above-described substrate for a printed circuit board.

A method for producing a substrate for a printed circuit board according to still another embodiment of the present invention, which has been made to address the above-described problem, includes a step of applying a conductive ink containing metal particles to at least one of surfaces of a base film having an insulating property, and performing heating in an atmosphere having an oxygen concentration of 1 ppm or more and 10,000 ppm or less at 150° C. or more and 500° C. or less to form a first conductive layer; and a step of performing plating to form a second conductive layer on a surface of the first conductive layer, the surface being on a side opposite to the base film, wherein the metal particles have a mean particle size of 1 nm or more and 500 nm or less.

Advantageous Effects of Invention

A substrate for a printed circuit board, a printed circuit board, and a method for producing a substrate for a printed circuit board according to the present invention enable a sufficient reduction in the thickness of the conductive layer at low cost.

DESCRIPTION OF EMBODIMENTS

Description of Embodiments of the Present Invention

Embodiments according to the present invention will be first listed and described.

A substrate for a printed circuit board according to an embodiment of the present invention includes a base film having an insulating property; a first conductive layer formed on at least one of surfaces of the base film by application of a conductive ink containing metal particles; and a second conductive layer formed, by plating, on a surface of the first conductive layer, the surface being on a side opposite to the base film. In the substrate for a printed circuit board, a region near an interface between the base film and the first conductive layer contains a metal oxide species based on a metal of the metal particles and a metal hydroxide species based on the metal of the metal particles, the metal oxide species in the region near the interface between the base film and the first conductive layer has a mass per unit area of 0.1 $\mu g/cm^2$ or more and 10 $\mu g/cm^2$ or less, and a mass ratio of the metal oxide species to the metal hydroxide species is 0.1 or more.

Incidentally, in the above description, the metal oxide species denotes a metal oxide or a group derived from the metal oxide, and the metal hydroxide species denotes a metal hydroxide or a group derived from the metal hydroxide. Here, the group derived from the metal oxide means a group in which an oxygen is bonded to the metal and also bonded to a non-hydrogen atom not on the metal side but on the other side. When the metal is copper, the examples include CuOC—R, CuON—R, and CuOOC—R (where R represents an alkyl group). Here, the group derived from the metal hydroxide means a group in which an oxygen is bonded to the metal and also bonded to a hydrogen not on the metal side but on the other side. When the metal is copper, the examples include CuOH, $Cu(OH)_2$, $CuSO_4.3Cu(OH)_2$, $CuCO_3.Cu(OH)_2$, $CuCl_2.Cu(OH)_2$, and $(Cu(OH)CH_3COO)_2.5H_2O$.

In the substrate for a printed circuit board, a first conductive layer is formed on at least one of the surfaces of the base film by application of a conductive ink containing metal particles, and a second conductive layer is formed by plating on a surface of the first conductive layer, the surface being on a side opposite to the base film. Thus, there is no need to use expensive vacuum equipment required for physical vapor deposition such as sputtering. For this reason, the size of the substrate for a printed circuit board is not limited by such vacuum equipment. In addition, in the substrate for a printed circuit board, the region near the interface between the base film and the first conductive layer contains a metal oxide species based on the metal of the metal particles and a metal hydroxide species based on the metal of the metal particles. In addition, in the substrate for a printed circuit board, the mass per unit area of the metal oxide species is within the above-described range, and the mass ratio of the metal oxide species to the metal hydroxide species is the above-described lower limit or more. As a result, the substrate for a printed circuit board has high adhesion strength between the base film and the first conductive layer without formation of an adhesive layer. The reason for this is not fully understood; however, the metal oxide species strongly bonds to the material forming the base film in the region near the interface, which probably results in enhancement of the adhesion strength.

In addition, in the substrate for a printed circuit board, the base film is disposed on the first conductive layer without any adhesive layer therebetween, which enables formation of a conductive layer having a sufficiently small thickness. Furthermore, in the substrate for a printed circuit board, a conductive ink containing metal particles is applied to thereby form the first conductive layer on at least one of surfaces of the base film. Thus, without limitation on the material of the base film, various base films can be employed to provide substrates for printed circuit boards. Incidentally, the second conductive layer formed by plating may be formed by, for example, electroless plating or electroplating. Alternatively, the second conductive layer may be formed by electroless plating and further by electroplating. Incidentally, "the region near the interface" used here means a region extending for predetermined ranges in both of the thickness directions from the interface between the base film and the first conductive layer. Such a predetermined range may be set to, for example, a distance that is about half of the thickness of the first conductive layer, preferably 0.1 µm.

The metal particles preferably have a mean particle size of 1 nm or more and 500 nm or less. Thus, a conductive ink containing metal particles having a particle size within this range is applied to thereby form a first conductive layer on a surface of the base film. This enables stable formation of a dense and uniform first conductive layer on the surface of the base film having an insulating property. This enables uniform formation of the second conductive layer by plating. Incidentally, "mean particle size" used here means the median diameter D50 in the particle size distribution in the dispersion liquid. The mean particle size can be measured with a particle size distribution analyzer (for example, Microtrac particle size analyzer "UPA-150EX" from NIKKISO CO., LTD.).

Gaps in the first conductive layer are preferably filled with the second conductive layer. Thus, in the first conductive layer formed by application of the conductive ink to the surface of the base film, the gaps are filled with the second conductive layer formed by plating. This makes the first conductive layer dense. The first conductive layer is thus made dense, which results in a decrease in the number of points where breaking starts in the first conductive layer and results in a further increase in the adhesion strength between the first conductive layer and the base film. Thus, separation of the first conductive layer from the base film is prevented with more certainty.

The surface of the base film on which the first conductive layer is formed is preferably subjected to a hydrophilic treatment. When the surface of the base film on which the first conductive layer is formed is subjected to a hydrophilic treatment, the conductive ink exhibits a decreased surface tension to the base film. This facilitates uniform application of the conductive ink to the surface of the base film. As a result, the first conductive layer is easily formed so as to have a uniform thickness on the surface of the base film.

The first conductive layer is preferably formed by heat-treating the applied conductive ink. Thus, the applied conductive ink is heat-treated, so that unwanted organic matter and the like in the conductive ink are removed to thereby fix the metal particles to the surface of the base film with more certainty.

The metal is preferably copper. When the metal is thus copper, the first conductive layer has increased conductivity, which enables production of a printed circuit board having high conductivity.

The metal particles are preferably obtained by a liquid-phase reduction method of reducing metal ions with a reducing agent in an aqueous solution. When the metal particles are thus obtained by the liquid-phase reduction method, compared with gas-phase methods, a relatively simple apparatus can be used for obtaining the particles, which enables a reduction in the production costs. In addition, such metal particles can be mass-produced with ease, which enables high availability of the metal particles. Furthermore, for example, stirring in the aqueous solution can easily make such metal particles have a uniform particle size.

The liquid-phase reduction method is preferably a titanium redox process. Thus, when the metal particles are obtained by the titanium redox process, the particle size can be set to a desired size on the order of nanometers with certainty and ease, and metal particles having a round shape and similar sizes tend to be obtained. As a result, the first conductive layer is formed as a dense and uniform layer having less defects.

A printed circuit board according to another embodiment of the present invention includes a conductive pattern, wherein the conductive pattern is formed by performing a subtractive method or a semi-additive method on the first conductive layer and the second conductive layer of the above-described substrate for a printed circuit board.

The printed circuit board is produced from the above-described substrate for a printed circuit board. Thus, the printed circuit board can be formed so as to have a small thickness. In addition, the adhesion strength is high between the base film and the conductive layer, so that the conductive layer is less likely to separate from the base film.

A method for producing a substrate for a printed circuit board according to still another embodiment of the present invention includes a step of applying a conductive ink containing metal particles to at least one of surfaces of a base film having an insulating property, and performing heating in an atmosphere having an oxygen concentration of 1 ppm or more and 10,000 ppm or less at 150° C. or more and 500° C. or less to form a first conductive layer; and a step of performing plating to form a second conductive layer on a surface of the first conductive layer, the surface being on a side opposite to the base film, wherein the metal particles have a mean particle size of 1 nm or more and 500 nm or less.

According to the method for producing a substrate for a printed circuit board, a first conductive layer is formed on at least one of the surfaces of the base film by application and heating of a conductive ink containing metal particles, and a second conductive layer is formed by plating on a surface of the first conductive layer, the surface being on a side opposite to the base film. Thus, there is no need to use expensive vacuum equipment required for physical vapor deposition such as sputtering. For this reason, the size of the substrate for a printed circuit board produced by the method for producing a substrate for a printed circuit board is not limited by such vacuum equipment. In addition, in the method for producing a substrate for a printed circuit board, the first conductive layer is formed on at least one of the surfaces of the base film by application of a conductive ink containing metal particles having the above-described particle size, and heating in the above-described temperature range in an atmosphere having an oxygen concentration in the above-described range. Thus, a large amount of the metal oxide species based on the metal of the metal particles is generated in a region of the first conductive layer, the region being near the interface between the first conductive layer and the base film. As a result, the adhesion strength between the base film and the first conductive layer is increased. In addition, in the method for producing a substrate for a printed circuit board, a conductive ink containing metal particles having the above-described particle size is applied to form the first conductive layer. This enables stable formation of a dense and uniform first conductive layer on at least one of the surfaces of the base film. Incidentally, in the step of forming the second conductive layer, for example, electroless plating may be performed to form the second conductive layer; or electroplating may be performed to form the second conductive layer; or electroless plating may be performed and followed by electroplating to form the second conductive layer.

DETAILS OF EMBODIMENTS OF THE PRESENT INVENTION

Hereinafter, a substrate for a printed circuit board, a printed circuit board, and a method for producing a substrate for a printed circuit board according to embodiments of the present invention will be described with reference to drawings.

[Substrate for Printed Circuit Board]

Figure 1:
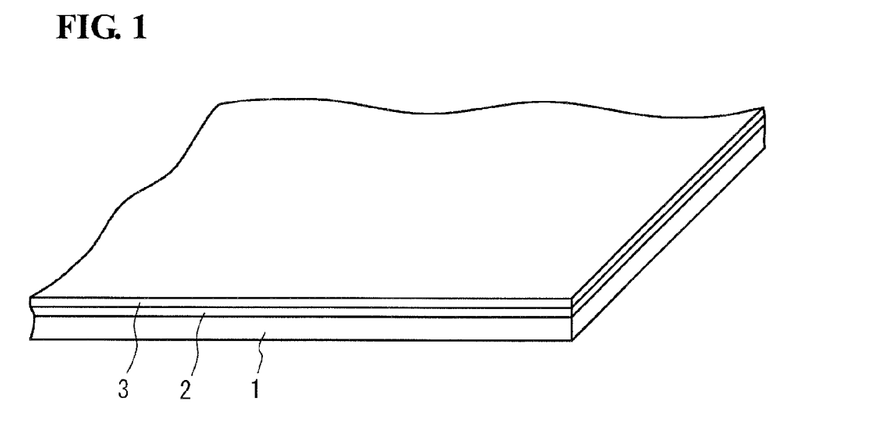
FIG. 1 is a schematic perspective view of a substrate for a printed circuit board according to an embodiment of the present invention.

The substrate for a printed circuit board in FIG. 1 includes a base film 1 having an insulating property, a first conductive layer 2 formed on one of the surfaces of the base film 1 by application of a conductive ink containing metal particles, and a second conductive layer 3 formed by plating on one of the surfaces of the first conductive layer 2. The region near the interface between the base film 1 and the first conductive layer 2 contains a metal oxide species based on the metal of the metal particles and a metal hydroxide species based on the metal of the metal particles.

<Base Film>

The base film 1 forming the substrate for a printed circuit board has an insulating property. Examples of the material for the base film 1 include flexible resins such as polyimide, liquid crystal polymers, fluororesins, polyethylene terephthalate, and polyethylene naphthalate; rigid materials such as phenolic resin impregnated paper, epoxy impregnated paper, glass composites, epoxy impregnated fiberglass cloth, Teflon (registered trademark), and glass base materials; and rigid-flexible materials that are composites of hard material and soft material. Of these, particularly preferred is polyimide because it exhibits high bonding strength to metal oxide species.

Since the thickness of the base film 1 is set in accordance with the printed circuit board for which the substrate for a printed circuit board is used, the thickness is not particularly limited. However, for example, the lower limit of the average thickness of the base film 1 is preferably 5 µm, more preferably 12 µM. The upper limit of the average thickness of the base film 1 is preferably 2 mm, more preferably 1.6 mm. When the average thickness of the base film 1 is less than the lower limit, the base film 1 may have insufficient strength. On the other hand, when the average thickness of the base film 1 is more than the upper limit, a reduction in the thickness of the printed circuit board may become difficult to achieve.

In the base film 1, the surface to be coated with the conductive ink is preferably subjected to a hydrophilic treatment. The hydrophilic treatment may be, for example, a plasma treatment of applying plasma to make the surface hydrophilic, or an alkali treatment of using an alkali solution to make the surface hydrophilic. By subjecting the base film 1 to such a hydrophilic treatment, the conductive ink exhibits a decreased surface tension to the base film 1, which facilitates uniform application of the conductive ink to the base film 1.

<First Conductive Layer>

The first conductive layer 2 is formed by applying a conductive ink containing metal particles, on one of the surfaces of the base film 1. In the substrate for a printed circuit board, the conductive ink is applied to form the first conductive layer 2. As a result, one of the surfaces of the base film 1 can be easily covered with such a conductive film. Incidentally, in order to remove unwanted organic matter and the like in the conductive ink to thereby fix the metal particles to one of the surfaces of the base film 1 with certainty, the first conductive layer 2 is preferably formed by heat-treating the applied conductive ink.

(Conductive Ink)

The conductive ink forming the first conductive layer 2 contains metal particles as a conductive material providing conductivity. This embodiment employs the conductive ink that contains metal particles, a dispersing agent for dispersing the metal particles, and a dispersion medium. Application of such a conductive ink causes the first conductive layer 2 of fine metal particles to be formed on one of the surfaces of the base film 1.

The metal forming the metal particles contained in the conductive ink is a metal that enables generation of a metal oxide species based on the metal and a metal hydroxide species based on the metal in a region of the first conductive layer 2, the region being near the interface between the first conductive layer 2 and the base film 1 in the substrate for a printed circuit board. The metal may be copper (Cu), nickel (Ni), aluminum (Al), gold (Au), or silver (Ag). Of these, copper is preferably used as a metal that has high conductivity and exhibits high adhesion to the base film 1.

Regarding the metal particles contained in the conductive ink, the lower limit of the mean particle size is preferably 1 nm, more preferably 30 nm. The upper limit of the mean particle size of the metal particles is preferably 500 nm, more preferably 100 nm. When the mean particle size of the metal particles is less than the lower limit, the metal particles in the conductive ink may have degraded dispersibility and stability. When the mean particle size of the metal particles is more than the upper limit, the metal particles may tend to precipitate and the conductive ink applied tends not to have a uniform density of the metal particles.

The lower limit of the average thickness of the first conductive layer 2 is preferably 0.05 µm, more preferably 0.1 µm. The upper limit of the average thickness of the first conductive layer 2 is preferably 2 µm, more preferably 1.5 µm. When the average thickness of the first conductive layer 2 is less than the lower limit, the first conductive layer 2 may have large portions not containing metal particles in the thickness direction, resulting in low conductivity. On the other hand, when the average thickness of the first conductive layer 2 is more than the upper limit, it may become difficult to achieve a reduction in the thickness of conductive layers.

(Interface Between Base Film and First Conductive Layer)

The region near the interface between the base film 1 and the first conductive layer 2 contains a metal oxide species based on the metal of the metal particles and a metal hydroxide species based on the metal of the metal particles. The metal oxide species and the metal hydroxide species are an oxide and a hydroxide generated, during heat treatment after application of the conductive ink, on the basis of metal particles contained in the first conductive layer 2. For example, when copper is used for the metal particles, copper oxide (CuO) or a group derived from copper oxide and copper hydroxide ($Cu(OH)_2$) or a group derived from copper hydroxide are generated and present in the region near the interface between the base film 1 and the first conductive layer 2.

Regarding the metal oxide species in the region near the interface between the base film 1 and the first conductive layer 2, the lower limit of the mass per unit area is 0.1 $\mu g/cm^2$, more preferably 0.15 $\mu g/cm^2$. The upper limit of the mass per unit area of the metal oxide species is 10 $\mu g/cm^2$, more preferably 5 $\mu g/cm^2$. When the mass per unit area of the metal oxide species is less than the lower limit, the metal oxide species provides a weaker effect of enhancing the bonding strength between the first conductive layer 2 and the base film 1, which may result in a decrease in the adhesion strength between the base film 1 and the first conductive layer 2. On the other hand, when the mass per unit area of the metal oxide species is more than the upper limit, heat treatment after application of the conductive ink may become difficult to control.

Regarding the metal hydroxide species in the region near the interface between the base film 1 and the first conductive layer 2, the lower limit of the mass per unit area is preferably 1 $\mu g/cm^2$, more preferably 1.5 $\mu g/cm^2$. The upper limit of the mass per unit area of the metal hydroxide species is preferably 100 $\mu g/cm^2$, more preferably 50 $\mu g/cm^2$. When the mass per unit area of the metal hydroxide species is less than the lower limit, after application of the conductive ink, heat treatment for generating a large amount of the metal oxide species may become difficult to control. On the other hand, when the mass per unit area of the metal hydroxide species is more than the upper limit, the amount of the metal oxide species correspondingly decreases, so that the metal oxide species provides a weaker effect of enhancing the bonding strength between the first conductive layer 2 and the base film 1. This may result in a decrease in the adhesion strength between the base film 1 and the first conductive layer 2.

Regarding the mass ratio of the metal oxide species to the metal hydroxide species in the region near the interface between the base film 1 and the first conductive layer 2, the lower limit is 0.1, more preferably 0.2. The upper limit of the mass ratio is preferably 5, more preferably 3. When the mass ratio is less than the lower limit, the metal hydroxide species has an excessively large amount relative to the metal oxide species in the region near the interface, which may result in a decrease in the adhesion strength between the base film 1 and the first conductive layer 2. On the other hand, when the mass ratio is more than the upper limit, heat treatment after application of the conductive ink may become difficult to control.

<Second Conductive Layer>

The second conductive layer 3 is formed by electroless plating on one of the surfaces of the first conductive layer 2. Thus, the second conductive layer 3 is formed by electroless plating, so that the gaps between the metal particles forming the first conductive layer 2 are filled with the metal of the second conductive layer 3. When the gaps are left in the first conductive layer 2, breaking starts at such gap portions, which tends to result in separation of the first conductive layer 2 from the base film 1. In contrast, the gap portions are filled with the second conductive layer 3, to thereby prevent separation of the first conductive layer 2.

Examples of the metal used for the electroless plating include highly conductive metals such as copper, nickel, and silver. When copper is used for the metal particles forming the first conductive layer 2, copper or nickel is preferably used in consideration of adhesion to the first conductive layer 2.

Regarding the second conductive layer 3 formed by electroless plating, the lower limit of the average thickness is preferably 0.2 μm, more preferably 0.3 μm. Regarding the second conductive layer 3 formed by the electroless plating, the upper limit of the average thickness is preferably 1 μm, more preferably 0.5 μm. When the average thickness of the second conductive layer 3 formed by the electroless plating is less than the lower limit, the second conductive layer 3 may insufficiently fill the gap portions of the first conductive layer 2, which may result in a decrease in the conductivity. On the other hand, when the average thickness of the second conductive layer 3 formed by the electroless plating is more than the upper limit, the time required for the electroless plating may increase, which may result in a decrease in the productivity.

Alternatively, formation of a thin layer by the electroless plating is preferably followed by electroplating to form a thick second conductive layer 3. The electroless plating is followed by electroplating, so that the thickness of the conductive layer can be adjusted with ease and accuracy, and the conductive layer having a thickness required for formation of a printed circuit can be formed in a relatively short time. Examples of the metal used for the electroplating include highly conductive metals such as copper, nickel, and silver.

The thickness of the second conductive layer 3 after the electroplating is set in accordance with the printed circuit to be formed and is not particularly limited. However, regarding the second conductive layer 3 after the electroplating, for example, the lower limit of the average thickness is preferably 1 more preferably 2 μm. Regarding the second conductive layer 3 after the electroplating, the upper limit of the average thickness is preferably 100 more preferably 50 μm. When the average thickness of the second conductive layer 3 after the electroplating is less than the lower limit, the conductive layer may be easily damaged. On the other hand, when the average thickness of the second conductive layer 3 after the electroplating is more than the upper limit, a reduction in the thickness of the printed circuit board may become difficult to achieve.

[Method for Producing Substrate for Printed Circuit Board]

The method for producing a substrate for a printed circuit board includes a step of forming a first conductive layer (first-conductive-layer formation step) by application of a conductive ink containing metal particles to one of the surfaces of a base film having an insulating property, and by heating at a predetermined temperature or higher in an atmosphere having a predetermined oxygen concentration or higher; and a step of forming a second conductive layer (second-conductive-layer formation step) on one of the surfaces of the first conductive layer by plating.

<First-Conductive-Layer Formation Step>

Figure 2A:
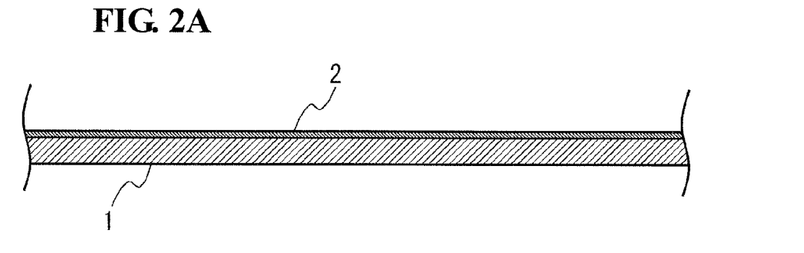
FIG. 2A is a schematic partial sectional view illustrating a method for producing the substrate for a printed circuit board in FIG. 1.

In the first-conductive-layer formation step, as illustrated in FIG. 2A, a conductive ink containing metal particles is applied to a surface of the base film 1, dried, and subsequently heat-treated.

(Method for Producing Metal Particles)

Here, a method for producing metal particles to be dispersed in the conductive ink will be described. The metal particles can be produced by, for example, a high-temperature treatment method, a liquid-phase reduction method, or a gas-phase method.

The liquid-phase reduction method is performed to produce the metal particles in the following manner: for example, a dispersing agent and a water-soluble metal compound serving as the source of metal ions that are to form the metal particles are dissolved in water, and a reducing agent is added to cause a reduction reaction of the metal ions for a period of time. The liquid-phase reduction method enables production of metal particles that uniformly have a spherical or granular shape and are also fine particles. Examples of the water-soluble metal compound serving as the source of metal ions include, in the case of copper, copper(II) nitrate ($Cu(NO_3)_2$) and copper(II) sulfate pentahydrate ($CuSO_4 \cdot 5H_2O$); in the case of silver, silver(I) nitrate ($AgNO_3$) and silver methanesulfonate ($CH_3SO_3Ag$); in the case of gold, tetrachloroauric(III) acid tetrahydrate ($HAuCl_4 \cdot 4H_2O$); and, in the case of nickel, nickel(II) chloride hexahydrate ($NiCl_2 \cdot 6H_2O$) and nickel(II) nitrate hexahydrate ($Ni(NO_3)_2 \cdot 6H_2O$). Also for other metal particles, water-soluble compounds such as chlorides, nitrate compounds, and sulfate compounds can be used.

When the liquid-phase reduction method is employed to produce metal particles, various reducing agents are usable that can reduce and precipitate metal ions in a liquid-phase (aqueous solution) reaction systems. Examples of the reducing agents include sodium borohydride, sodium hypophosphite, hydrazine, transition metal ions such as trivalent titanium ions and divalent cobalt ions, ascorbic acid, reducing sugars such as glucose and fructose, and polyhydric alcohols such as ethylene glycol and glycerin. Of these, trivalent titanium ions are used to perform a titanium redox process: the redox action during oxidation into tetravalent ions is used to reduce metal ions to precipitate metal particles. The titanium redox process provides metal particles that uniformly have a small particle size. In addition, the titanium redox process can provide metal particles that have a spherical or granular shape. Thus, use of the titanium redox process enables filling with metal particles at higher density, to thereby form the first conductive layer 2 as a denser layer.

The particle size of metal particles can be controlled by adjusting the types and mixing proportions of the metal compound, dispersing agent, and reducing agent, and by adjusting, during the reduction reaction of the metal compound, the stirring rate, temperature, time, and pH, for example. For example, the pH of the reaction system is preferably adjusted to 7 or more and 13 or less in order to obtain metal particles having a very small particle size for this embodiment. At this time, a pH adjuster may be used to adjust the pH of the reaction system to be in such a range. This pH adjuster is a common acid or alkali such as hydrochloric acid, sulfuric acid, sodium hydroxide, or sodium carbonate. In particular, in order to prevent deterioration of surrounding members, preferred are nitric acid and ammonia that are free from impurity elements, for example, alkali metals, alkaline-earth metals, halogen elements such as chlorine, sulfur, phosphorus, and boron.

(Preparation of Conductive Ink)

Hereinafter, the method for preparing the conductive ink will be described. The dispersing agent contained in the conductive ink may be selected from various dispersing agents that have a molecular weight of 2,000 or more and 300,000 or less, and enable sufficient dispersion of metal particles precipitated in the dispersion medium. Use of such a dispersing agent having a molecular weight in the above-described range enables metal particles to be sufficiently dispersed in the dispersion medium, so that the resultant first conductive layer 2 has film properties of being dense and free from defects. When the dispersing agent has a molecular weight less than the lower limit, the effect of preventing aggregation of metal particles to maintain the dispersion may be insufficiently provided. As a result, the first conductive layer that is dense and has few defects may not be formed on the base film 1. On the other hand, when the dispersing agent has a molecular weight more than the upper limit, the dispersing agent may be excessively bulky, so that, in the heat treatment performed after application of the conductive ink, sintering between metal particles may be inhibited, which may result in generation of voids. In addition, when the dispersing agent is excessively bulky, the first conductive layer 2 may have a degraded film property of denseness, or the decomposition residue of the dispersing agent may cause a decrease in the conductivity.

The dispersing agent is preferably free from sulfur, phosphorus, boron, halogen elements, and alkali metals from the viewpoint of preventing deterioration of parts. Preferred examples of the dispersing agent include those having a molecular weight in the above-described range: amine-based polymeric dispersing agents such as polyethyleneimine and polyvinylpyrrolidone; hydrocarbon-based polymeric dispersing agents intramolecularly having carboxy groups such as polyacrylic acid and carboxymethylcellulose; and polymeric dispersing agents having polar groups such as poval (polyvinyl alcohol), styrene-maleic acid copolymers, olefin-maleic acid copolymers, and copolymers having a polyethyleneimine moiety and a polyethylene oxide moiety in a single molecule.

The dispersing agent may be dissolved in water or a water-soluble organic solvent, and the resultant solution may be added to the reaction system. The content of the dispersing agent is preferably 1 part by mass or more and 60 parts by mass or less relative to 100 parts by mass of the metal particles. The dispersing agent surrounds the metal particles to thereby prevent aggregation and sufficiently disperse the metal particles. However, when the content of the dispersing agent is less than the lower limit, this effect of preventing aggregation may be insufficiently provided. On the other hand, when the content of the dispersing agent is more than the upper limit, during heat treatment after application of the conductive ink, the dispersing agent in the excessive amount may inhibit firing including sintering of the metal particles to cause generation of voids; or, the decomposition residue of the polymeric dispersing agent may remain as impurities in the first conductive layer to cause a decrease in the conductivity.

The content of water serving as a dispersion medium in the conductive ink is preferably 20 parts by mass or more and 1900 parts by mass or less relative to 100 parts by mass of the metal particles. Water serving as the dispersion medium causes the dispersing agent to be sufficiently swelled to thereby enable sufficient dispersion of the metal particles surrounded by the dispersing agent. However, when the water content is less than the lower limit, this effect of swelling the dispersing agent exerted by water may be insufficiently provided. On the other hand, when the water content is more than the upper limit, the conductive ink has a low content of the metal particles, which may hamper formation of a good first conductive layer having required thickness and density on a surface of the base film 1.

An organic solvent optionally added to the conductive ink may be selected from various water-soluble organic solvents. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of, for example, polyhydric alcohols such as ethylene glycol and glycerin; and glycol ethers such as ethylene glycol monoethyl ether and diethylene glycol monobutyl ether.

The content of the water-soluble organic solvent is preferably 30 parts by mass or more and 900 parts by mass or less relative to 100 parts by mass of the metal particles. When the content of the water-soluble organic solvent is less than the lower limit, the effect of adjusting the viscosity of the dispersion liquid and adjusting the vapor pressure, the effect being exerted by the organic solvent, may be insufficiently provided. On the other hand, when the content of the water-soluble organic solvent is more than the upper limit, the effect of swelling the dispersing agent exerted by water may be insufficiently provided, which may result in occurrence of aggregation of the metal particles in the conductive ink.

Incidentally, when the liquid-phase reduction method is employed to produce the metal particles, metal particles precipitated in a liquid-phase (aqueous solution) reaction system are subjected to steps such as filtering off, washing, drying, and pulverization, and the resultant powder is used for preparation of the conductive ink. In this case, the metal particles in powder form, water serving as the dispersion medium, a dispersing agent, and optionally a water-soluble organic solvent may be mixed with predetermined proportions to thereby prepare a conductive ink containing the metal particles. In this case, the liquid phase (aqueous solution) in which the metal particles are precipitated is preferably used as the starting material to prepare the conductive ink. Specifically, the liquid phase (aqueous solution) containing precipitated metal particles is subjected to processes such as ultrafiltration, centrifugation, washing with water, and electrodialysis to remove impurities, and optionally concentrated to remove water. Alternatively, water is conversely added to adjust the concentration of the metal particles, and optionally a water-soluble organic solvent is then added with a predetermined proportion to prepare a conductive ink containing the metal particles. This method prevents generation of coarse and nonuniform particles due to aggregation of the metal particles during drying, which facilitates formation of a dense and uniform first conductive layer 2.

(Application of Conductive Ink)

The method of applying the conductive ink containing dispersed metal particles to one of the surfaces of the base film 1 can be selected from conventional and known coating methods such as spin coating, spray coating, bar coating, die coating, slit coating, roll coating, and dip coating. Alternatively, for example, the conductive ink may be applied to only a portion of one of the surfaces of the base film 1 by screen printing or with a dispenser.

(Heat Treatment)

The conductive ink is applied to one of the surfaces of the base film 1, dried, and subsequently heat-treated. The conductive ink applied to one of the surfaces of the base film 1 is then heat-treated, to thereby provide the first conductive layer 2 as a fired coating layer fixed to one of the surfaces of the base film 1. The heat treatment causes the dispersing agent and other organic matter contained in the applied conductive ink to be removed from the coating layer through evaporation and decomposition. As a result, the metal particles are left in a sintered state or at a pre-sintered stage in which metal particles are closely in contact with each other to achieve bonding between the solids.

In a region of the first conductive layer 2, the region being near the interface between the first conductive layer 2 and the base film 1, the heat treatment causes oxidation of the metal particles, to thereby suppress generation of a metal hydroxide species based on the metal of the metal particles, and to generate a metal oxide species based on the metal. Specifically, for example, when copper is used for the metal particles, copper oxide and copper hydroxide are generated in a region of the first conductive layer 2, the region being near the interface between the first conductive layer 2 and the base film 1, and the amount of generation is larger for the copper oxide. The copper oxide generated in the near-interface region of the first conductive layer 2 strongly bonds to the polyimide forming the base film 1, which increases the adhesion strength between the first conductive layer 2 and the base film 1.

The heat treatment is performed in an atmosphere having a certain oxygen content. Regarding the atmosphere in the heat treatment, the lower limit of the oxygen concentration is 1 ppm, more preferably 10 ppm. The upper limit of the oxygen concentration is 10,000 ppm, more preferably 1,000 ppm. When the oxygen concentration is less than the lower limit, the amount of copper oxide generated decreases in the near-interface region of the first conductive layer 2, so that an insufficient adhesion strength may be provided between the first conductive layer 2 and the base film 1. On the other hand, when the oxygen concentration is more than the upper limit, the metal particles are excessively oxidized, which may result in a decrease in the conductivity of the first conductive layer 2.

The lower limit of the temperature of the heat treatment is 150° C., more preferably 200° C. The upper limit of the temperature of the heat treatment is preferably 500° C., more preferably 400° C. When the temperature of the heat treatment is less than the lower limit, the amount of copper oxide generated decreases in the near-interface region of the first conductive layer 2, so that an insufficient adhesion strength may be provided between the first conductive layer 2 and the base film 1. On the other hand, when the temperature of the heat treatment is more than the upper limit and the base film 1 is formed of an organic resin such as polyimide, the base film 1 may be deformed.

<Second-Conductive-Layer Formation Step>

Figure 2B:
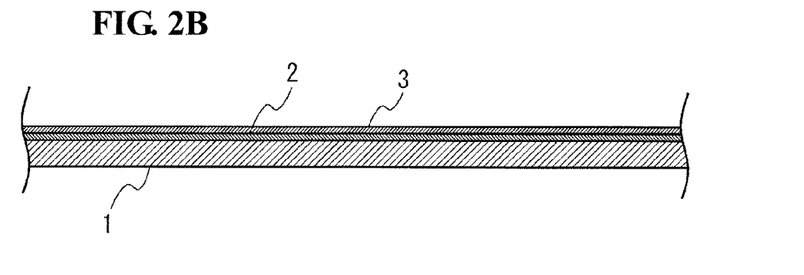
FIG. 2B is a schematic partial sectional view illustrating the method for producing the substrate for a printed circuit board in FIG. 1.

In the second-conductive-layer formation step, as illustrated in FIG. 2B, a second conductive layer 3 is formed by electroless plating on one of the surfaces of the first conductive layer 2, which is formed on the base film 1 in the first-conductive-layer formation step.

Incidentally, the electroless plating is performed together with processes such as a cleaner step, a water-washing step, an acid treatment step, a water-washing step, a pre-dip step, an activator step, a water-washing step, a reduction step, and a water-washing step.

When the conductive layer is required to have an average thickness of, for example, 1 μm or more, electroless plating is performed and then electroplating is further performed until the required thickness of the conductive layer is achieved. This electroplating can be performed with a conventional and known electroplating bath corresponding to the plating metal such as copper, nickel, or silver and under conditions appropriately selected, such that a conductive layer having a predetermined thickness without defects can be quickly formed.

After the second-conductive-layer formation step is performed to form the second conductive layer 3, additional heat treatment is preferably performed. Such a heat treatment performed after formation of the second conductive layer 3 causes a further increase in the amount of the metal oxide species in a region of the first conductive layer 2, the region being near the interface between the first conductive layer 2 and the base film 1, resulting in a further increase in the adhesion strength between the base film 1 and the first conductive layer 2.

[Printed Circuit Board]

The printed circuit board is produced by forming a conductive pattern in the substrate for a printed circuit board in FIG. 1. The conductive pattern is formed in the first conductive layer 2 and the second conductive layer 3 of the substrate for a printed circuit board by a subtractive method or a semi-additive method.

[Method for Producing Printed Circuit Board]

Hereinafter, description will be made regarding an embodiment of the method for producing the printed circuit board employing the above-described substrate for a printed circuit board. Here, the case of forming the conductive pattern by a subtractive method will be described.

Figure 3A:
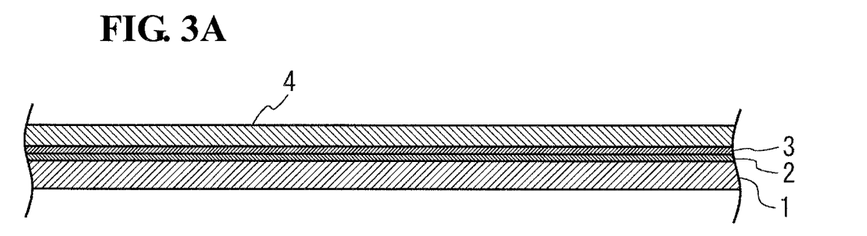
FIG. 3A is a schematic partial sectional view illustrating a method for producing a printed circuit board using the substrate for a printed circuit board in FIG. 1.
Figure 3B:
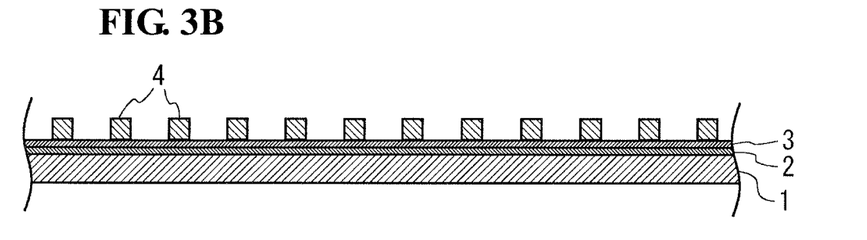
FIG. 3B is a schematic partial sectional view illustrating the method for producing a printed circuit board using the substrate for a printed circuit board in FIG. 1.
Figure 3C:
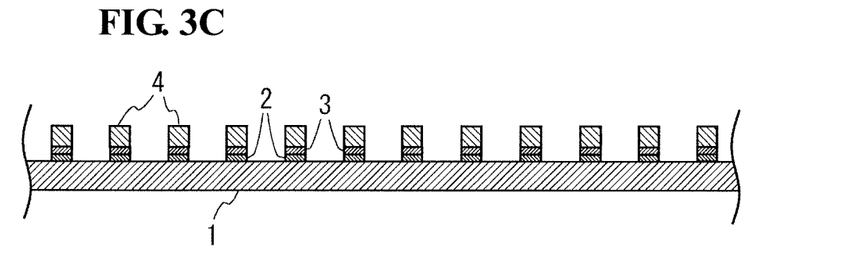
FIG. 3C is a schematic partial sectional view illustrating the method for producing a printed circuit board using the substrate for a printed circuit board in FIG. 1.
Figure 3D:
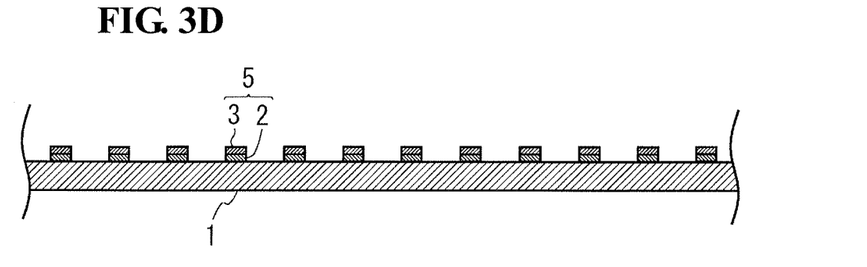
FIG. 3D is a schematic partial sectional view illustrating the method for producing a printed circuit board using the substrate for a printed circuit board in FIG. 1.

As illustrated in FIG. 3A, a photosensitive resist 4 is first formed so as to cover one of the surfaces of the substrate for a printed circuit board, the substrate having been adjusted to a predetermined size. Subsequently, as illustrated in FIG. 3B, the resist 4 is patterned so as to correspond to the conductive pattern by exposure and development, for example. Subsequently, as illustrated in FIG. 3C, portions of the second conductive layer 3 and the first conductive layer 2 other than the conductive pattern are etched off through the resist 4 serving as a mask. Finally, as illustrated in FIG. 3D, the remaining resist 4 is removed, to thereby provide a printed circuit board having a conductive pattern 5 formed on the base film 1.

Here, the description has been made regarding the method for producing a printed circuit board in which circuitry is formed by the subtractive method. Alternatively, the printed circuit board can also be produced by forming circuitry by another known production method such as a semi-additive method. Since the printed circuit board is produced with the above-described substrate for a printed circuit board, it is formed so as to have a sufficiently small thickness for meeting the demand for a high-density printed circuit. In addition, the printed circuit board has high adhesion strength between the base film 1 and the first conductive layer 2, so that the conductive layer is less likely to separate from the base film 1.

Advantages

In the substrate for a printed circuit board, the region near the interface between the base film and the first conductive layer contains a predetermined amount of a metal oxide species based on the metal particles contained in the first conductive layer; and the mass ratio of the metal oxide species to the metal hydroxide species is a predetermined value or more. As a result, the first conductive layer and the base film have high adhesion strength therebetween, so that the conductive layer is less likely to separate from the base film.

In addition, in the substrate for a printed circuit board, high adhesion strength is provided between the first conductive layer and the base film without using any adhesive. This enables low-cost production of a high-density printed circuit board in which the conductive layer and the base film have high adhesion strength therebetween.

In addition, in the substrate for a printed circuit board, adjustments of the oxygen concentration of the atmosphere and the heating temperature during heat treatment enable control of the amount of the metal oxide species generated in the region near the interface between the base film and the first conductive layer. As a result, the adhesion strength between the first conductive layer and the base film can be enhanced.

Other Embodiments

The embodiments disclosed herein are mere examples in all respects and should be understood as being non-limitative. The scope of the present invention is not limited to the above-described configurations of the embodiments and is indicated by Claims. The scope of the present invention is intended to embrace all the modifications within the meaning and range of equivalency of the Claims.

In the above-described embodiment, the first conductive layer 2 and the second conductive layer 3 are formed on one of the surfaces of the base film 1. Alternatively, such a formation method may be similarly performed to provide a double-sided substrate for a printed circuit board in which the first conductive layer and the second conductive layer are formed on each of both surfaces of the base film. Alternatively, the substrate for a printed circuit board obtained in the above-described embodiment may be subjected to formation of another conductive layer by another method on the other surface of the substrate. For example, a conductive layer may be formed by electroplating on the other surface of the substrate for a printed circuit board.

In the above-described embodiment, as illustrated in FIG. 2A, the conductive ink containing metal particles is applied to a surface of the base film 1. However, prior to the application of the conductive ink, the surface of the base film 1 may be subjected to a hydrophilic treatment. By subjecting the base film 1 to such a hydrophilic treatment, the conductive ink exhibits a decreased surface tension to the base film 1. This facilitates uniform application of the conductive ink to the base film 1.

EXAMPLES

Hereinafter, the present invention will be described further in detail with reference to Examples; however, the present invention is not limited to these Examples.

Examples

Five types of substrates for printed circuit boards were produced as Examples, Test No. 1 to No. 5 in Table 1, so as to differ in the heat-treatment conditions and the size of the metal particles contained in the conductive ink applied to form the first conductive layer.

The substrate for a printed circuit board described as Test No. 1 in Table 1 was produced in the following manner. Copper particles having a mean particle size of 60 nm were first dispersed in water as a medium, to thereby prepare a conductive ink having a copper concentration of 26 mass %. Subsequently, a polyimide film (Kapton EN-S from DU PONT-TORAY CO., LTD.) having an average thickness of 12 μm was used as the base film having an insulating property. The conductive ink was applied to one of the surfaces of the polyimide film, and dried in the air to form a first conductive layer having an average thickness of 0.15 μm. Furthermore, a heat treatment was performed at 350° C. in a nitrogen atmosphere having an oxygen concentration of 100 ppm for 30 minutes. Subsequently, one of the surfaces of the first conductive layer was subjected to electroless plating with copper, to thereby form an electroless-plated second conductive layer having an average thickness of 0.4 μm. Furthermore, electroplating was performed to obtain a substrate for a printed circuit board, the substrate including a copper conductive layer having an average thickness of 18 μm.

A substrate for a printed circuit board of Test No. 2 was produced and obtained as with the above-described substrate for a printed circuit board of Test No. 1 except that the copper particles dispersed in the conductive ink had a mean particle size of 40 nm. A substrate for a printed circuit board of Test No. 3 was produced and obtained as with the above-described substrate for a printed circuit board of Test No. 1 except that the copper particles dispersed in the conductive ink had a mean particle size of 85 nm. A substrate for a printed circuit board of Test No. 4 was produced and obtained as with the above-described substrate for a printed circuit board of Test No. 1 except that the copper particles dispersed in the conductive ink had a mean particle size of 65 nm, and the oxygen concentration during the heat treatment was 500 ppm. A substrate for a printed circuit board of Test No. 5 was produced and obtained as with the above-described substrate for a printed circuit board of Test No. 1 except that the copper particles dispersed in the conductive ink had a mean particle size of 40 nm, and the heat-treatment conditions were set to 400° C. for 30 minutes.

Comparative Examples

A substrate for a printed circuit board of Test No. 6 was produced and obtained, as a Comparative Example, as with the above-described substrate for a printed circuit board of Test No. 1 except that the copper particles dispersed in the conductive ink had a mean particle size of 650 nm.

A substrate for a printed circuit board produced without application of conductive ink containing dispersed copper particles was prepared as another Comparative Example. This substrate for a printed circuit board was produced in the following manner. One of the surfaces of the polyimide film was subjected to electroless plating with copper to form an electroless-plated layer having an average thickness of 0.5 μm. Furthermore, electroplating was performed to form a conductive layer having an average thickness of 18 μm. The substrate for a printed circuit board as Test No. 7 in Table 1 is the substrate for a printed circuit board of this Comparative Example.

<Evaluation for Adhesion Strength>

The substrates for printed circuit boards of Test No. 1 to No. 7 were measured for the peel strength (g/cm) between the polyimide film and the conductor layer, to thereby evaluate the adhesion strength between the polyimide film and the conductor layer. The measurement for peel strength was performed in accordance with JIS-C6471 (1995) such that the conductor layer was peeled in the 180° direction with respect to the polyimide film. The measurement results of peel strength are described in Table 1.

<Measurements of Amount of Copper Oxide and Amount of Copper Hydroxide>

Regarding each of the substrates for printed circuit boards of Test No. 1 to No. 7, a surface of the conductor layer peeled in the Evaluation for adhesion strength, the surface having been disposed on the polyimide film, was measured by an electrochemical measurement evaluation method. Specifically, a three-electrode-system electrochemical measurement cell was connected to a commercially available potentiostat, and changes in the current were measured while a constant potential was applied. In this electrochemical measurement, the electrolytic solution used was a strongly alkaline aqueous solution containing $Li^+$ ions (6 M KOH and 1 M LiOH); the reference electrode immersed in this electrolytic solution was a silver-silver chloride (Ag/AgCl) electrode; the counter electrode was a platinum (Pt) electrode; and the object to be measured was the above-described peeled conductor layer. While the potential at the conductor layer with respect to the reference electrode was swept at a constant rate toward the negative potential, a current flowing due to reduction of copper oxide or copper hydroxide was measured. Specifically, a graph was created in terms of the potential between the reference electrode and the conductor layer and measured current values corresponding to changes in the potential. The peak potential on the graph was used to determine as to whether copper oxide and copper hydroxide were present or not; and the peak area (quantity of electricity) was used to quantify the copper oxide and copper hydroxide. Table 1 shows the amounts of copper oxide and copper hydroxide per unit area determined by the electrochemical measurement evaluation method, and mass ratios of copper oxide to copper hydroxide.

TABLE 1

| Test No. | Peel strength (g/cm) | Copper oxide ($\mu g/cm^2$) | Copper hydroxide ($\mu g/cm^2$) | Copper oxide/ copper hydroxide |
|---|---|---|---|---|
| 1 | 820 | 0.5 | 1.0 | 0.5 |
| 2 | 750 | 0.7 | 1.0 | 0.7 |
| 3 | 680 | 2.9 | 1.0 | 2.9 |
| 4 | 1000 | 5.2 | 1.5 | 3.5 |
| 5 | 950 | 9.5 | 2.2 | 4.3 |
| 6 | 250 | 0.1 | 1.5 | 0.07 |
| 7 | 200 | 0 | 1.2 | 0 |

[Evaluation Results]

The results in Table 1 indicate the following. The Test No. 1 to No. 5 substrates for printed circuit boards have high peel strengths of 600 g/cm or more, which means that high adhesion strength is provided between the polyimide film and the conductive layer. In contrast, the Test No. 6 and No. 7 substrates for printed circuit boards have low peel strengths, which means that the conductive layer is likely to separate from the polyimide film.

In the Test No. 1 to No. 5 substrates for printed circuit boards, the interface region with respect to the polyimide film has a large amount of copper oxide of 0.5 $\mu g/cm^2$ or more, and the mass ratio of copper oxide to copper hydroxide is a large value of 0.5 or more. These are probably the reasons why the high adhesion strength was provided between the polyimide film and the conductive layer.

On the other hand, in the Test No. 6 substrate for a printed circuit board, the interface region with respect to the polyimide film contains copper oxide but has a small copper oxide amount relative to copper hydroxide. This is probably the reason why the low adhesion strength was provided between the polyimide film and the conductive layer.

Comparison between the results of Test No. 1, No. 2, and No. 6 indicates the following: with an increase in the particle size of the metal particles forming the first conductive layer, in the interface region with respect to the polyimide film, the amount of copper oxide generated decreases, whereas the amount of copper hydroxide generated increases. In the Test No. 6 substrate for a printed circuit board, the metal particles dispersed in the conductive ink had an excessively large particle size, which caused a decrease in the amount of copper oxide generated, the copper oxide contributing to enhancement of adhesion strength. This is probably the reason why the low adhesion strength was provided between the polyimide film and the conductive layer.

The results of Test No. 7 indicate the following: when a conductive layer is formed on a polyimide film by plating without applying a conductive ink, copper oxide contributing to enhancement of adhesion strength is not generated in the region near the interface between the conductive layer and the polyimide film.

INDUSTRIAL APPLICABILITY

A substrate for a printed circuit board, a printed circuit board, and a method for producing a substrate for a printed circuit board according to embodiments of the present invention enable a sufficient reduction in the thickness of the conductive layer at low cost, and hence are suitably used for printed circuit boards and the like required to have high-density printed circuits.

REFERENCE SIGNS LIST

1 base film; 2 first conductive layer; 3 second conductive layer; 4 resist; 5 conductive pattern

The invention claimed is:

1. A substrate for a printed circuit board, comprising:
a base film having an insulating property;
a first conductive layer formed on at least one of surfaces of the base film by application of a conductive ink containing metal particles; and
a second conductive layer formed, by plating, on a surface of the first conductive layer, the surface being on a side opposite to the base film,
wherein a region near an interface between the base film and the first conductive layer contains a metal oxide species based on a metal of the metal particles and a metal hydroxide species based on the metal of the metal particles,
the metal oxide species in the region near the interface between the base film and the first conductive layer has a mass per unit area of 0.1 $\mu g/cm^2$ or more and 10 $\mu g/cm^2$ or less, and a mass ratio of the metal oxide species to the metal hydroxide species is 0.1 or more.

2. The substrate for a printed circuit board according to claim 1, wherein the metal particles have a mean particle size of 1 nm or more and 500 nm or less.

3. The substrate for a printed circuit board according to claim 1, wherein gaps in the first conductive layer are filled with the second conductive layer.

4. The substrate for a printed circuit board according to claim 1, wherein the surface of the base film on which the first conductive layer is formed is subjected to a hydrophilic treatment.

5. The substrate for a printed circuit board according to claim 1, wherein the first conductive layer is formed by heat-treating the applied conductive ink.

6. The substrate for a printed circuit board according to claim 1, wherein the metal is copper.

7. The substrate for a printed circuit board according to claim 1, wherein the metal particles are obtained by a liquid-phase reduction method of reducing metal ions with a reducing agent in an aqueous solution.

8. The substrate for a printed circuit board according to claim 7, wherein the liquid-phase reduction method is a titanium redox process.

9. A printed circuit board comprising a conductive pattern, wherein the conductive pattern is formed by performing a subtractive method or a semi-additive method on the first conductive layer and the second conductive layer of the substrate for a printed circuit board according to claim 1.

* * * * *